United States Patent [19]
Brasca et al.

[11] Patent Number: 5,396,119
[45] Date of Patent: Mar. 7, 1995

[54] MOS POWER TRANSISTOR DEVICE WITH TEMPERATURE COMPENSATION

[75] Inventors: Guido Brasca, Varese; Edoardo Botti, Vigevano, both of Italy

[73] Assignee: SGS-Thomson Microelectronics S.r.l., Agrate Brianza, Italy

[21] Appl. No.: 47,803

[22] Filed: Apr. 15, 1993

[30] Foreign Application Priority Data

Apr. 17, 1992 [EP] European Pat. Off. ............ 92830189

[51] Int. Cl.⁶ .............................................. H03K 3/26
[52] U.S. Cl. .................................. 327/513; 327/565; 327/566; 327/432; 327/108
[58] Field of Search ......... 307/310, 491, 303.1–303.2, 307/270, 570

[56] References Cited

U.S. PATENT DOCUMENTS

| | | | |
|---|---|---|---|
| 4,430,586 | 2/1984 | Hebenstreit | 307/570 |
| 4,901,127 | 2/1990 | Chow et al. | 307/570 |
| 4,940,906 | 7/1990 | Gulczynski | 307/570 |
| 4,992,844 | 2/1991 | Yakushiji | 307/570 |
| 5,001,366 | 3/1991 | Masuda et al. | 307/570 |

FOREIGN PATENT DOCUMENTS

| | | |
|---|---|---|
| 0282734 | 9/1988 | European Pat. Off. |
| 0384900 | 8/1990 | European Pat. Off. |
| 3821460 | 4/1989 | Germany |

OTHER PUBLICATIONS

Patent Abstracts of Japan, vol. 9, No. 99 (E-311)(1822) Apr. 27 1985 & JP-AS-59224172 (Hitachi Seisakusho) 17 Dec. 1984.

*Primary Examiner*—Margaret Rose Wambach
*Attorney, Agent, or Firm*—Wolf, Greenfield & Sacks

[57] ABSTRACT

A device including a MOS power transistor, and a temperature sensor including a bipolar transistor integrated in the MOS transistor and having its emitter and collector connected directly to the source and gate terminals respectively of the MOS transistor. Parallel to the base-emitter junction of the bipolar transistor, there is connected a voltage source for biasing the junction to such a value that the bipolar transistor remains off at room temperature, and absorbs the maximum current supplied by a drive circuit of the MOS transistor at the maximum permissible temperature TUM. At temperature TUM, the bipolar transistor takes over control of the gate-source voltage of the MOS transistor for maintaining thermal feedback of the device at maximum temperature TUM.

25 Claims, 3 Drawing Sheets

FIG. 3

MOS POWER TRANSISTOR DEVICE WITH TEMPERATURE COMPENSATION

BACKGROUND OF THE INVENTION

1. Field of the Invention

The present invention relates to a MOS power transistor device.

2. Discussion of the Related Art

MOS power transistors are known to be damaged by exceeding the maximum power dissipatable by the device (and which is constant alongside variations in drain-source voltage), as in the case of shortcircuiting or overloading, which produce a substantial increase in the temperature of the chip integrating the MOS transistors. To overcome this problem, several types of protection have been proposed, none of which, however, have proved entirely effective.

Temperature sensing devices as applied to bipolar power transistors are already known (see, for example, the article by Robert J. Widlar and Mineo Yamatake entitled "Dynamic Safe-Area Protection for Power Transistors Employs Peak-Temperature Limiting", IEEE Journal of Solid-State Circuits, Vol. SC-22, No. 1, February 1987). Such devices consist of a PN junction distributed throughout the bipolar power transistor close to the active emitter. In a typical application described in the above article, the junction is biased by a current source so that the drop at the junction is zero when the limit temperature is reached. An operational amplifier has its input connected to the junction terminals, and, on the limit temperature being exceeded, takes over control of the base circuit of the power transistor to regulate the temperature. Such a solution, however, is not applicable to MOS power transistors.

It is an object of the present invention to provide a MOS power device enabling highly effective protection against overloading and shortcircuiting.

SUMMARY OF THE INVENTION

According to one aspect of the present invention, a bipolar sensing transistor is integrated and appropriately located inside the MOS power transistor, for detecting the temperature inside the chip integrating the MOS transistor, and, in the event the maximum permissible temperature is exceeded, so regulating the gate-source voltage drop of the MOS transistor to prevent a further increase in temperature.

According to the invention, the MOS power transistor device includes an MOS power transistor having source, gate, and drain regions connected to respective source, gate, and drain terminals, the source and drain regions being formed in a chip portion of semiconducting material. A temperature sensor including a bipolar transistor integrated in the portion surrounded at least partially by the MOS power transistor, and having an emitter region connected directly to the source region, and a base region connected to a separate fourth terminal of the device.

BRIEF DESCRIPTION OF THE DRAWINGS

Two preferred, non-limiting embodiments of the present invention will be described by way of example with reference to the accompanying drawings, in which:

FIG. 3 shows a cross section of a chip integrating the FIG. 1 device;

DETAILED DESCRIPTION

Figure 1:
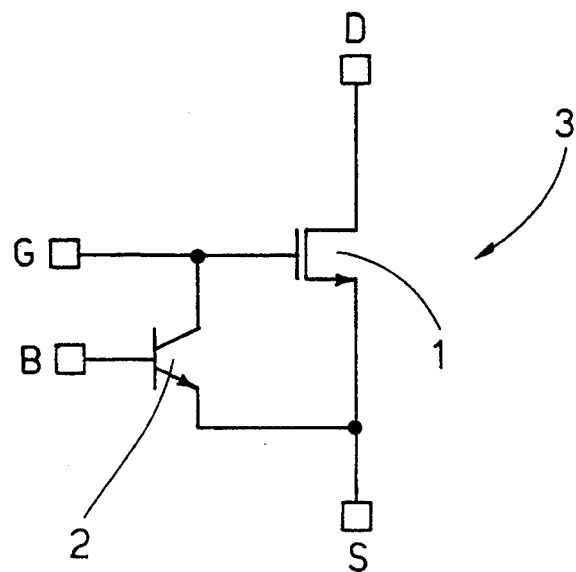
FIG. 1 shows a simplified schematic diagram of a first embodiment of the device according to the present invention.

Number 1 in FIG. 1 indicates a MOS power transistor to be protected against overloading or shortcircuiting. As shown in FIG. 1, provision is also made for a bipolar NPN transistor 2 having the collector region connected to the gate regions of MOS transistor 1 and to gate terminal G; the emitter region connected to the source regions of MOS transistor 1 and to source terminal S; and the base region connected to its own terminal B. MOS transistor 1 also presents a drain terminal D.

Transistor 2 defines a temperature sensing element, and is integrated in an insulated pocket formed inside MOS transistor 1 to produce a four-terminal device 3 which, by virtue of being integrated with it, is capable of detecting the temperature of MOS transistor 1.

Figure 3:
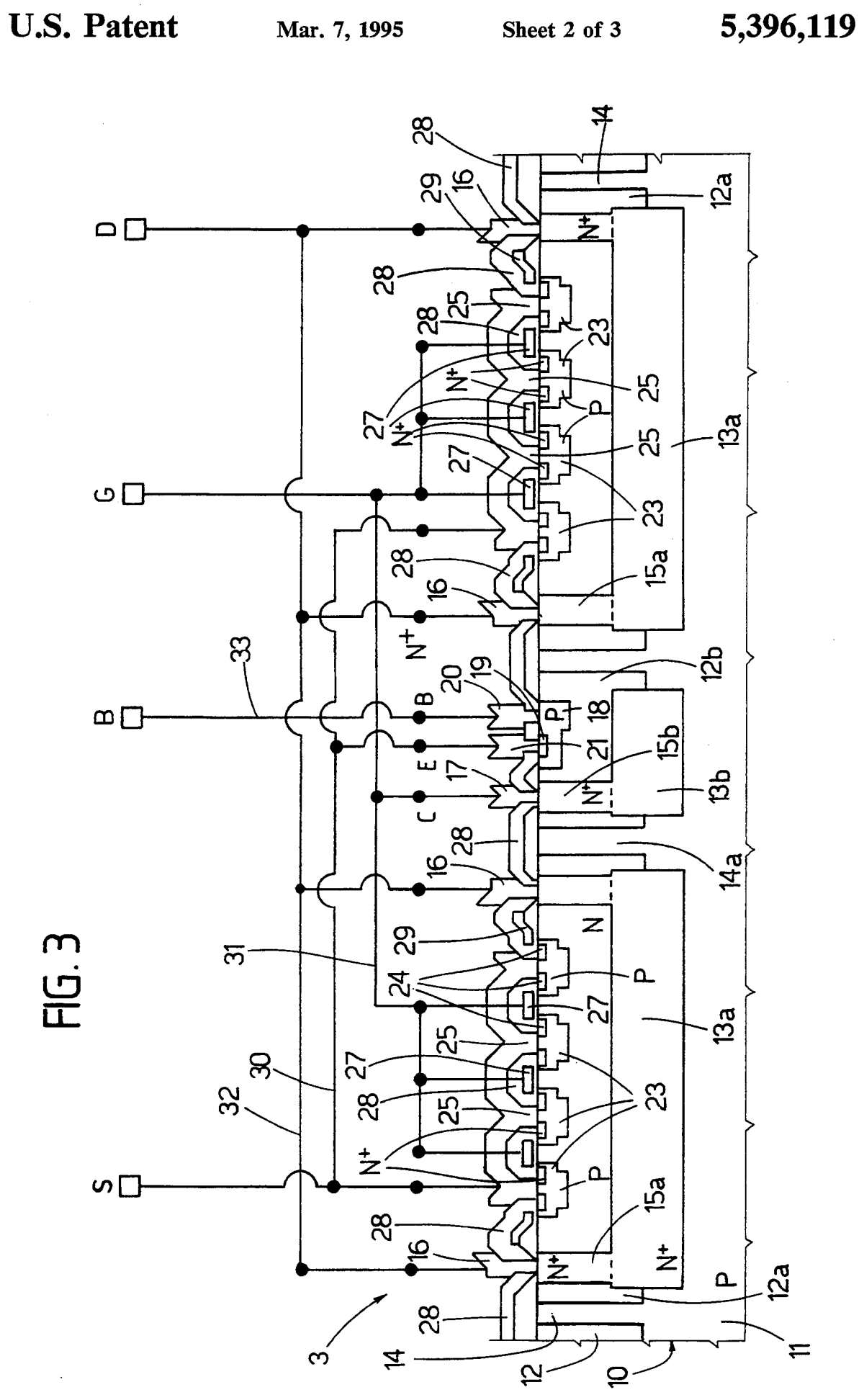

One embodiment of device 3 is shown by way of example in FIG. 3, which shows a cross section of chip 10 through the portion of MOS transistor 1 integrating sensing transistor 2.

In detail, FIG. 3 shows a grounded P-type substrate 11 over which extends an N-type epitaxial layer 12. Across the junction formed by substrate 11 and epitaxial layer 12, there extend buried N+-type layers 13a, 13b. Together with the epitaxial layer, buried layers 13a form the drain regions of MOS transistor 1, while layer 13b forms the collector of sensing transistor 2. Epitaxial layer 12 is divided into a number of pockets isolated from one another by P-type isolating regions 14 extending from substrate 11 to the upper surface defined by epitaxial layer 12. More specifically, when viewed from above, one isolating region 14a defines a loop interposed partially between buried layers 13a, 13b, so as so to separate pocket 12b housing sensing transistor 2 from pocket 12a surrounding pocket 12b on all sides and housing MOS transistor 1.

Buried layers 13a, 13b are connected by respective N+-type sinkers 15a, 15b to drain contact 16 and collector contact 17 respectively.

Epitaxial pocket 12b houses the P-type base region 18 of sensing transistor 2, connected to contact 20 and in turn housing an N+-type emitter region 19 connected to contact 21.

Pocket 12a houses P-type body regions 23, each of which houses a pair of N+-type regions 24 forming the source regions of MOS transistor 1 and connected to respective contacts 25. On the surface defined by epitaxial layer 12, between regions 24 of adjacent body regions 23, provision is made for polycrystalline silicon gate regions 27 embedded in a layer of oxide 28 which, with the obvious exception of the contacts, covers the entire surface of epitaxial layer 12. Inside oxide layer 28, provision is also made for polycrystalline silicon field plate protection regions 29, for protecting the junctions of device 3.

As shown schematically in FIG. 3, over oxide layer 28 there extend connections 30 for connecting source regions 24 to one another, to emitter region 19 and terminal S; connections 31 for connecting gate regions 27 to one another, to collector region 15b, 13b and terminal G; connections 32 for connecting drain regions 12a, 13a, 15a to one another and to terminal D; and connection 33 for connecting base region 18 to terminal B. The above connections may be metallized for high current, and include a polycrystalline silicon layer for low current (in this case the gate connections). The process permitting, provision may also be made for metallization at two levels.

Figure 2:
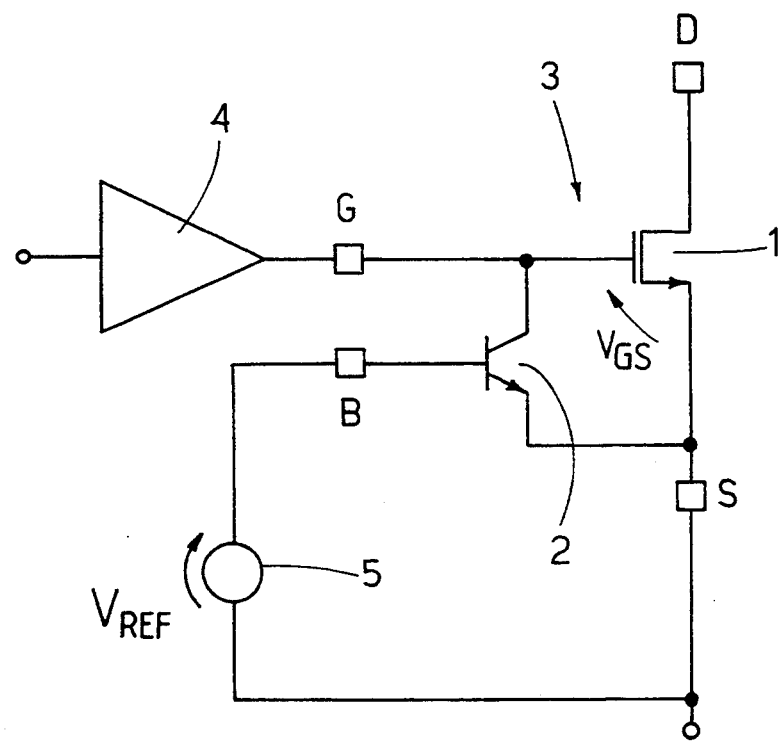
FIG. 2 shows a circuit diagram of one application of the FIG. 1 device.

FIG. 2 shows one possible application of FIG. 1 device 3, wherein 4 indicates an ordinary circuit for driving MOS transistor 1, and 5 a voltage source between base terminal B of sensing transistor 2 and source terminal S, for biasing the base-emitter junction of sensing transistor 2 to reference voltage $V_{REF}$.

In the FIG. 2 circuit, if $I_{MAX}$ is the maximum current supplied by drive circuit 4, $V_{REF}$ is so selected as to keep transistor 2 off at room temperature, and generate a collector current of $I_C = I_{MAX}$ at the maximum permissible temperature $T_{UM}$.

By so doing, under normal operating conditions, sensing transistor 2 is off, and MOS transistor 1 operates normally. As the temperature of MOS transistor 1 increases, however, e.g. due to excessive dissipation caused by shortcircuiting or overloading, sensing transistor 2 gradually starts to conduct up to temperature $T_{UM}$, at which it absorbs the maximum current $I_{MAX}$ supplied by drive circuit 4, thus rendering control of the voltage drop at the gate-source junction of MOS transistor 1 independent of drive circuit 4. In this phase, it is sensing transistor 2 that sets the voltage drop $V_{GS}$ at the gate-source junction so that it equals the voltage drop between its own collector and emitter, thus preventing any further increase in temperature, and maintaining thermal feedback of the system at temperature $T_{UM}$.

Figure 4:
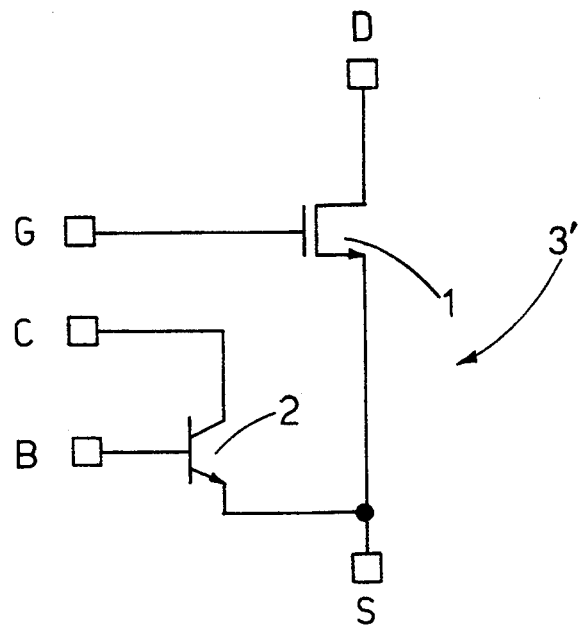
FIG. 4 shows a simplified schematic diagram of a second embodiment of the device according to the present invention.

FIG. 4 shows a further embodiment of the device, suitable for applications in which the drive device of MOS transistor 1 includes a differential stage (P-channel MOS or bipolar PNP transistors). In this case, due to possible unbalancing of the differential stage by sensing transistor 2 if the collector of the latter were to be connected directly to the output of the differential stage, collector terminal C of sensing transistor 2, instead of being connected to the gate terminal of MOS transistor 1, is brought outside the device, here indicated by 3'.

Figure 5:
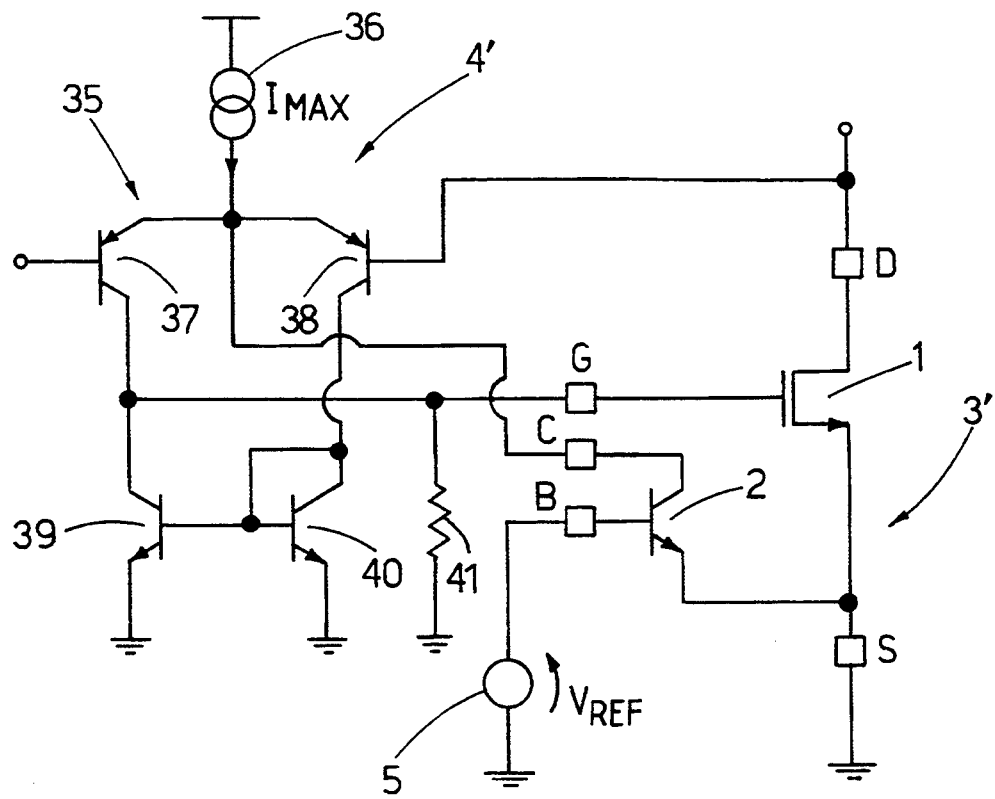
FIG. 5 shows a circuit diagram of one application of the FIG. 4 device.

In this case, device 3' is preferably connected to the drive circuit as shown in FIG. 5, wherein the drive circuit 4' comprises a differential stage 35 in turn comprising a bias current source 36 supplying current $I_{MAX}$; a pair of PNP transistors 37, 38; and a differential-single output conversion stage comprising an NPN transistor 39 and diode-connected NPN transistor 40. More specifically, current source 36 is located between the supply line and mutually connected emitters of transistors 37, 38; the emitters of transistors 37, 38 are also connected to collector terminal C of sensing transistor 2. The base terminal of transistor 37 defines the input of differential stage 35; the base terminal of transistor 38 is connected to drain terminal D of MOS transistor 1; the collector of transistor 37 is connected to the collector of transistor 39 and gate terminal G of MOS transistor 1; the emitter of transistor 39 is grounded, and the base connected to the base of diode-connected transistor 40, the collector of which is connected to the collector terminal of transistor 38. A high-power resistor 41 is provided between gate terminal G of MOS transistor 1 and ground. A voltage source 5 is connected between the base and emitter terminals of sensing transistor 2.

Device 3' in FIG. 5 operates in the same way as FIG. 2 device 3, i.e. on reaching temperature $T_{UM}$, it absorbs the maximum current $I_{MAX}$ supplied by source 36, so as to control the gate-source voltage drop of MOS transistor 1 and so prevent any further increase in temperature, but without unbalancing differential stage 4' at temperatures below $T_{UM}$ (normal operating condition).

The advantages of the device according to the present invention will be clear from the foregoing description. In particular, it provides for effective SOA (Safe Operating Area) protection, troublefree layout, and a good MOS transistor/sensing transistor area ratio.

Moreover, the control circuit ensuring safe operation of the device is extremely straightforward in design and, therefore, highly reliable and cheap to produce.

Unlike conventional protection circuits, the solutions described herein provide for fully exploiting the high output power capacity of the MOS transistor, even in the presence of highly reactive loads.

To those skilled in the art it will be clear that changes may be made to the device as described and illustrated herein without, however, departing from the scope of the present invention. The foregoing description is not to be considered to be limiting. The invention is limited only as defined in the following claims and the equivalents thereto.

What is claimed is:

1. An MOS power transistor device, comprising:
   an MOS power transistor having source, gate, and drain regions connected to respective source, gate, and drain terminals, the source and drain regions being formed in a chip portion of semiconducting material; and
   a temperature sensor including a bipolar transistor integrated in the chip portion, surrounded at least partially by the MOS power transistor, and having an emitter region connected directly to the source region, and a base region connected to a separate fourth terminal of the device.

2. The device of claim 1, wherein the bipolar transistor is an NPN transistor.

3. The device of claim 1, wherein the bipolar transistor comprises a collector region connected to the gate region.

4. The device of claim 1, wherein the base region is connected to a first terminal of a voltage source and the voltage source has a second terminal connected to the source and emitter regions.

5. The device of claim 3, wherein the collector region is connected directly to the gate region by a line extending over the chip portion.

6. The device of claim 3, wherein the collector region defines a separate fifth terminal of the device.

7. The device of claim 6, further comprising a drive circuit including a differential stage comprising a pair of transistors having mutually connected terminals and wherein the separate fifth terminal is connected to the mutually connected terminals of the pair of transistors.

8. The device of claim 3, wherein the chip portion comprises:
   a substrate of a first conductivity type:
   an epitaxial layer of an opposite conductivity type housing the source and drain regions and at least one isolating region extending in a loop and surrounded by a number of source and drain regions;

the isolating region electrically separating from the rest of the epitaxial layer an epitaxial pocket housing the collector, base, and emitter regions of the bipolar transistor.

9. The device of claim 8, further comprising, across a junction of the substrate and the epitaxial layer, buried layers of the opposite conductivity type, one of the buried layers being surrounded by the isolating region and defining the collector region and connected to a larger surface of the device by a sinker, the epitaxial pocket housing the base region of the first conductivity type, and the base region housing the emitter region of the opposite conductivity type.

10. The device of claim 8, further comprising over the epitaxial layer, first connections of electrically conductive material connecting the source regions to the emitter region.

11. The device of claim 10, wherein on top of the epitaxial layer, a number of gate regions are connected by second connections of electrically conductive material to the collector region.

12. An MOS power transistor integrated circuit, comprising:

an MOS power transistor; and a temperature sensor including a bipolar transistor having a first terminal coupled to a first terminal of the MOS power transistor and a second terminal coupled to a first external terminal on the integrated circuit.

13. The integrated circuit of claim 12, wherein the bipolar transistor is disposed adjacent the MOS power transistor in the integrated circuit.

14. The integrated circuit of claim 13, wherein the bipolar transistor comprises a third terminal coupled to a second terminal of the MOS power transistor.

15. The integrated circuit of claim 13, wherein the bipolar transistor comprises a third terminal coupled to a second external terminal on the integrated circuit.

16. The integrated circuit of claim 15, wherein the bipolar transistor comprises an NPN transistor.

17. The integrated circuit of claim 16, wherein the first, second, and third terminals of the bipolar transistor are emitter, base, and collector terminals, respectively.

18. The integrated circuit of claim 17, wherein the first and second terminals of the MOS power transistor are source and drain terminals, respectively.

19. The integrated circuit of claim 18, wherein the integrated circuit comprises:

a substrate of a first conductivity type;

an epitaxial layer of a second conductivity type housing a plurality of source and drain regions of the MOS power transistor disposed on the substrate;

at epitaxial pocket disposed in the epitaxial layer housing collector, base, and emitter regions of the bipolar transistor; and an isolating region at least partially surrounding the epitaxial pocket and electrically isolating the epitaxial pocket from the epitaxial layer.

20. The integrated circuit of claim 19, further comprising, across a junction of the substrate and the epitaxial layer, buried layers of the second conductivity type, one of the buried layers being surrounded by the isolating region and defining the collector region and connected to a surface of the integrated circuit by a sinker, the epitaxial pocket housing the base region of the first conductivity type and the base region housing the emitter region of the second conductivity type.

21. The integrated circuit of claim 20, further comprising first connections of electrically conductive material, extending over the epitaxial layer, coupling the source regions to the emitter region.

22. The integrated circuit of claim 21, further comprising second connections of electrically conductive material, on top of the epitaxial layer, coupling a plurality of gate regions to the collector region.

23. A method of regulating a gate-source voltage drop in an MOS transistor to control a temperature of the MOS transistor, comprising the steps of:

coupling a gate region of the MOS transistor to a collector region of a bipolar transistor and a source region of the MOS transistor to an emitter region of the bipolar transistor; and biasing the bipolar transistor so that the bipolar transistor is off at a first predetermined temperature, conducts a maximum current at a second predetermined temperature, and conducts a current in a range between the first and second predetermined temperature as a function of a temperature of the bipolar transistor.

24. The method of claim 23, further comprising the step of using only the bipolar transistor to control a voltage drop at a gate-source junction of the MOS transistor at the second predetermined temperature.

25. The method of claim 24, wherein the second predetermined temperature is greater than the first predetermined temperature.

* * * * *